United States Patent [19]
Monno

[11] Patent Number: 5,311,304
[45] Date of Patent: May 10, 1994

[54] APPARATUS FOR THE POSITIONING OF COMPONENTS ON A PRINTED CIRCUIT BOARD OR THE LIKE

[76] Inventor: Bernd Monno, Teterower Ring 22, D-7744 Berlin, Fed. Rep. of Germany

[21] Appl. No.: 905,542

[22] Filed: Jun. 8, 1992

[30] Foreign Application Priority Data

Jun. 10, 1991 [DE] Fed. Rep. of Germany ........ 4119401

[51] Int. Cl.$^5$ .......................... H04N 7/18; H05K 3/39
[52] U.S. Cl. ...................................... 348/87; 356/399; 29/833
[58] Field of Search ...................... 358/93, 101; 382/8; 361/400, 403; 228/180.2; 356/399; 29/833; H04N 7/18

[56] References Cited

U.S. PATENT DOCUMENTS

| | | | |
|---|---|---|---|
| 4,737,845 | 4/1988 | Susuki | 358/101 |
| 4,899,921 | 2/1990 | Bendat | 228/180.2 |
| 5,060,063 | 10/1991 | Freeman | 358/101 |
| 5,096,353 | 3/1992 | Tesh | 358/101 |
| 5,140,643 | 8/1992 | Izumi | 382/8 |
| 5,152,055 | 10/1992 | L'Esperance | 358/101 |

*Primary Examiner*—Howard W. Britton
*Attorney, Agent, or Firm*—Paul F. Schenck

[57] ABSTRACT

The apparatus for positioning electronic components on a printed circuit board or the like includes an optical system which allows to line-up the underside of the electronic component with the intended placement position on the circuit board. After proper positioning the circuit board relative the electronic component the later is placed on the circuit board and connected therewith.

26 Claims, 10 Drawing Sheets

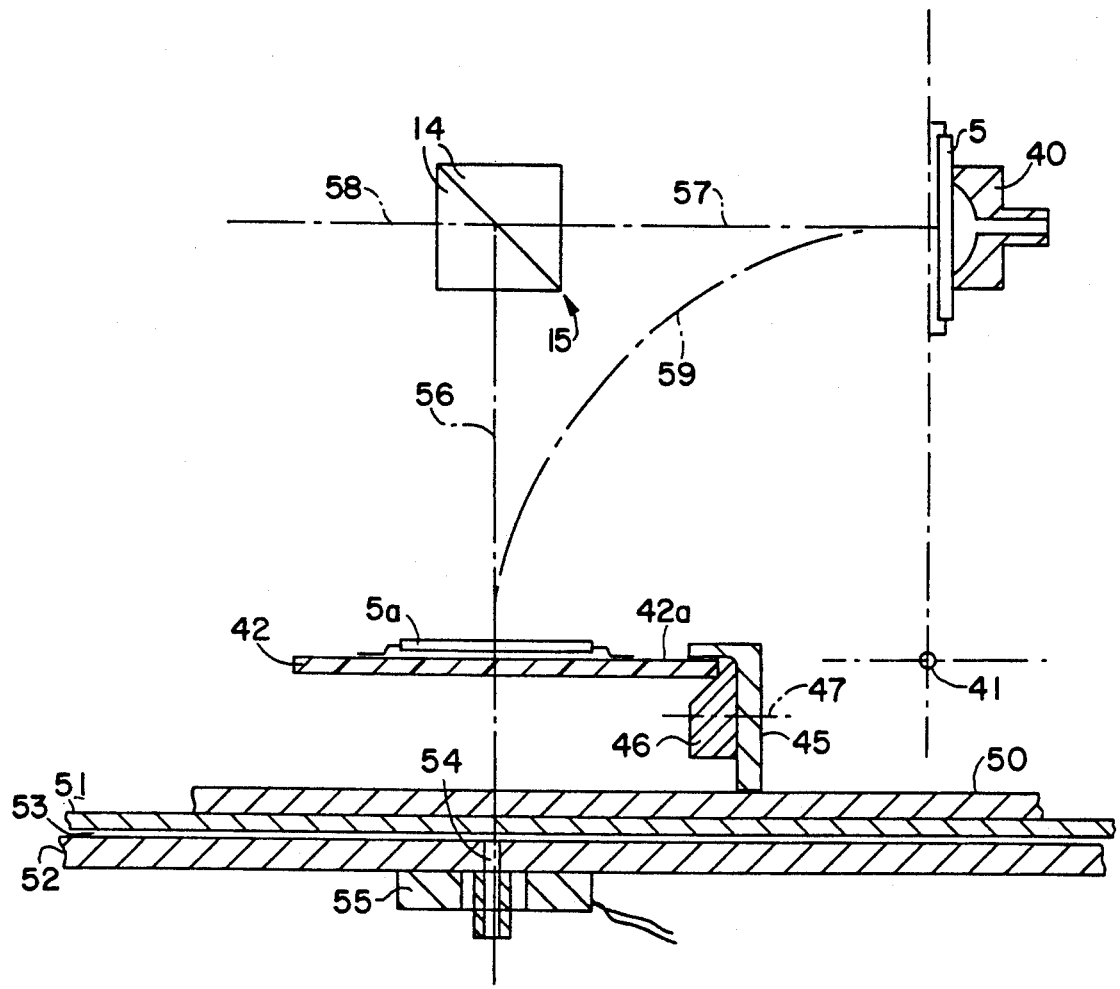
F I G. 3B

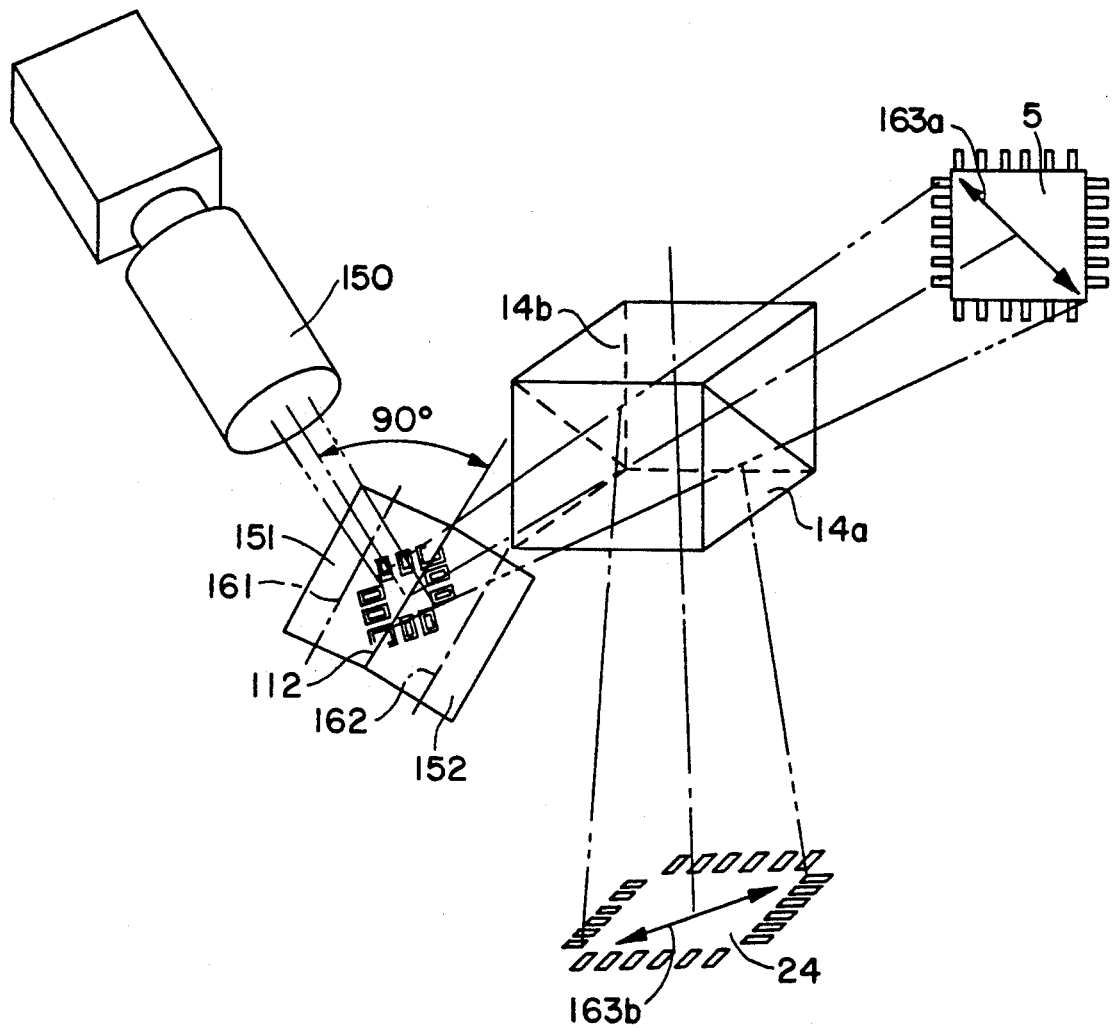
F I G. 4

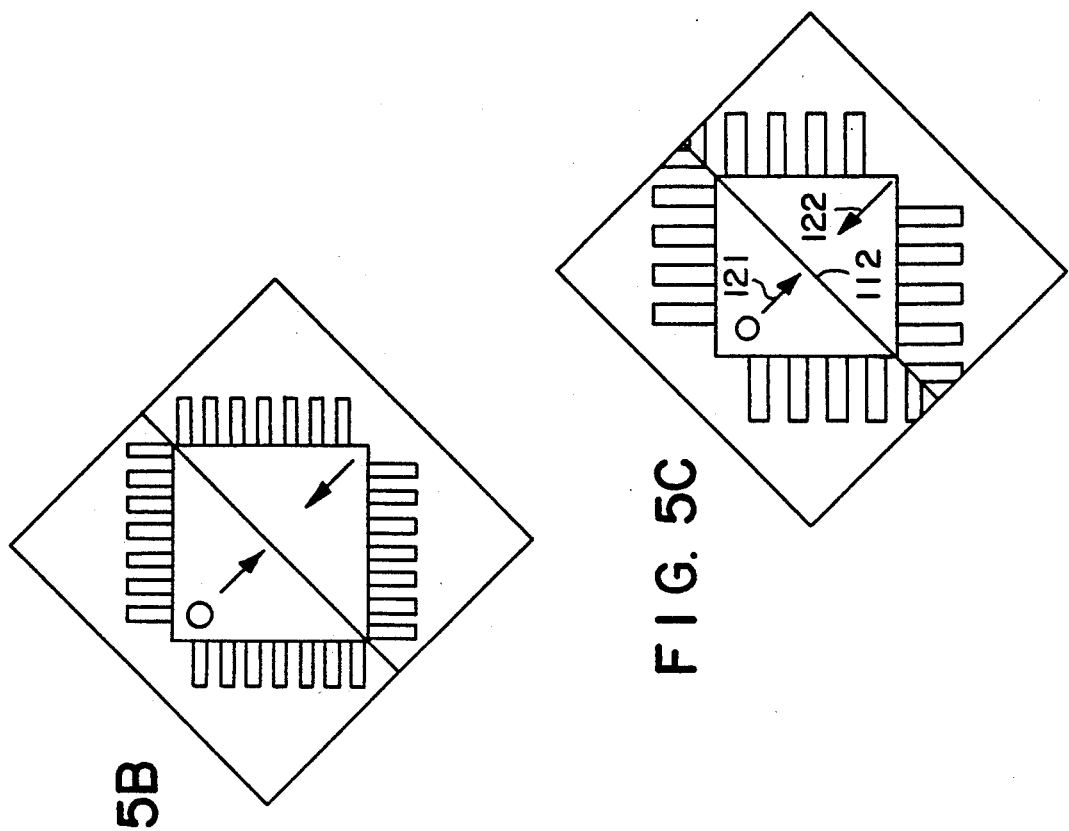
FIG. 5B
FIG. 5C
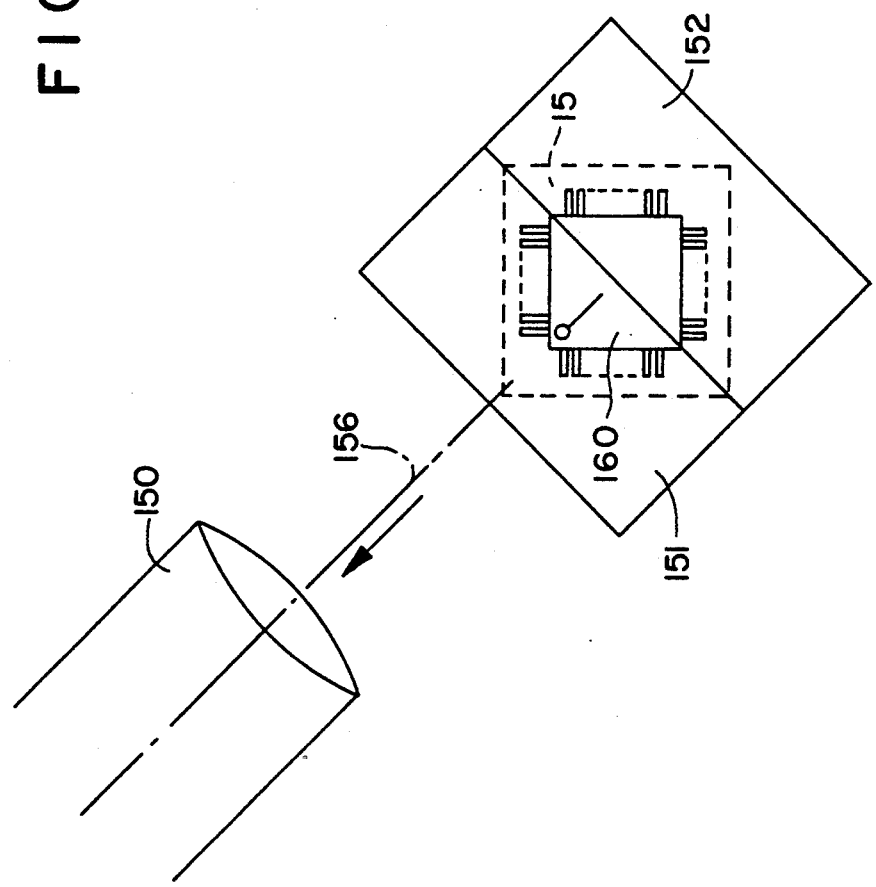
FIG. 5A

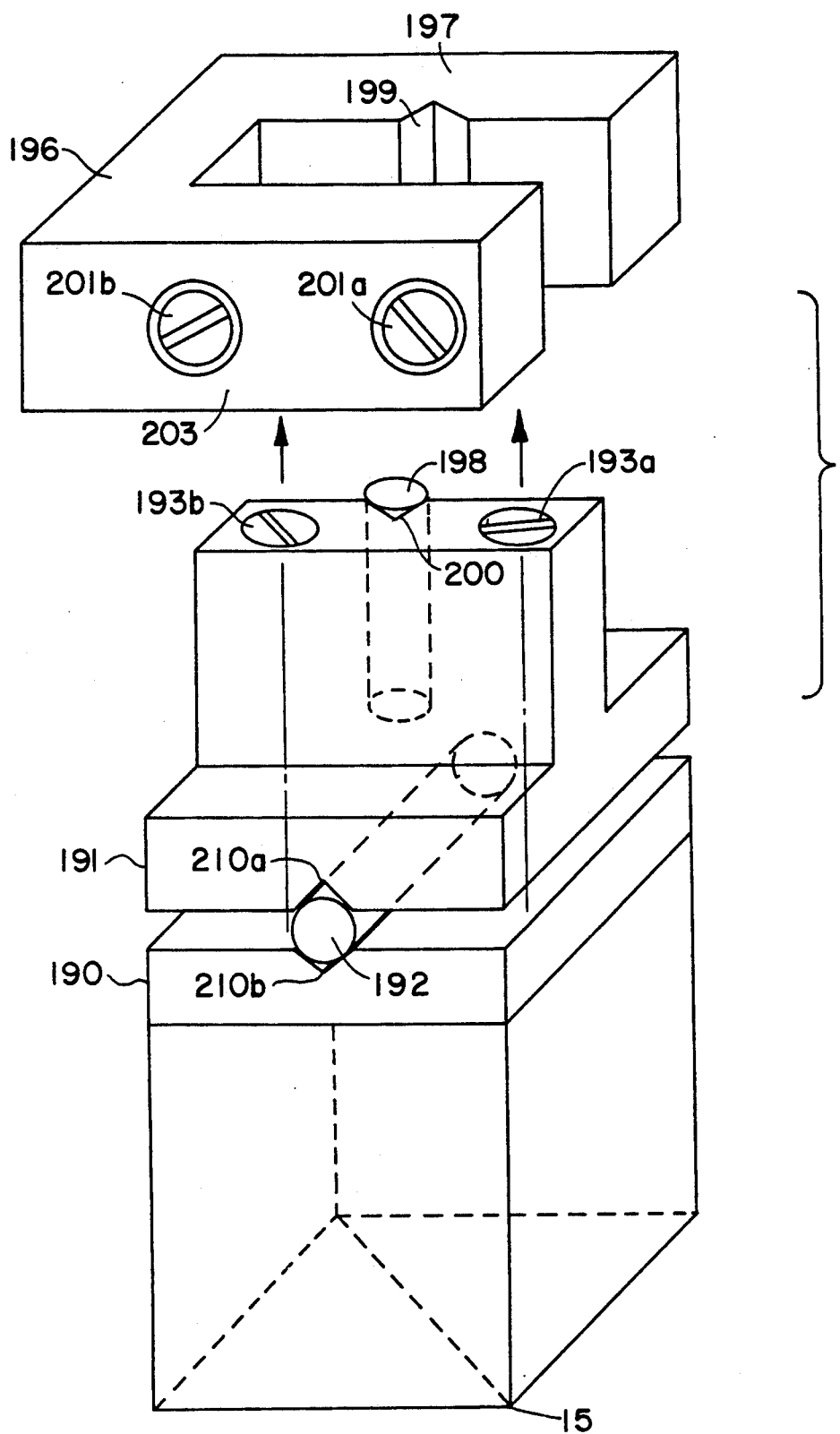
F I G. 7B

APPARATUS FOR THE POSITIONING OF COMPONENTS ON A PRINTED CIRCUIT BOARD OR THE LIKE

BACKGROUND OF THE INVENTION

The invention relates to means for positioning of electronic components on printed wiring boards. More specifically, the invention relates to an apparatus for precision positioning of individual electronic components on printed wiring boards.

FIG. 8 is an illustration of the optical path and functional principle of a known fine placement apparatus using a video camera for observing placement of a component on a component carrier. Component 100 which is to be placed on a component carrier 101 is held in a component fixture 102 at the end of a placement rod 103. Placement rod 103 can be moved in a direction normal to component carrier 101. Rod 103 moved through opening 104 in mirror 105. The movement of rod 103 allows to load a component 100 on to fixture 102 of rod 103. Rod 103 is then lowered towards component carrier 101. The image of the top side of component 100 and the placement area surrounding on component carrier 101 around component 100 is mirrored by mirror 105 onto a dual mirror 106, where the image is reflected into the optic of vertical camera 107. This arrangement can only match the leads of component 100 with the foot print pads on component carrier 101 as far as these pads are not covered by the terminals of component 100. In a version for placing large components mirror 106 is implemented as dual mirror with the common edge of the two partial mirrors 108a and 108b being turned 45 degree relative to the projected image of component 100. In this arrangement component 100 is out of focus until it is just above the placement location. The placement location on component carrier 101 is covered by component 100 until the same is close to the placement location. At this time component carrier 101 has to be positioned so that the terminals of components 100 match the foot print pattern of the placement location on component carrier 101. The placement of components with terminals underneath the package provides additional difficulties, because none of these terminals are visible during the placement process.

The German Patent DD 242 320 discloses an apparatus for positioning of electronic components having a large number of terminals, especially surface mount components on printed wiring boards. In this publication the printed wiring board is mounted on an x-y table and the component is held by vacuum on the holding fixture of a pivoted placement arm. The under side of the component and the top surface of the printed circuit board are illuminated by a light source. A semi reflective optical mirror provides a combined real image of the component and the position at which the placement arm could position the component. The combined images can be observed through a microscope. By proper positioning of the printed circuit board using the controls of the x-y table the image of the desired positioning location for the component on the printed circuit board and the under side of the component held in the holding fixture of the positioning arm are matched. Without further change in the position of the printed circuit board the positioning arm is lowered onto the printed circuit board placing the component in the desired position. Releasing the vacuum allows to lift the positioning arm away from the component.

While this apparatus functions satisfactorily the arrangement of optical components and positioning arm is complex. It was discovered that positioning was not always as precise as expected despite proper adjustment of the images of the desired position on the printed circuit board and the electronic component.

With increased size of the components it became apparent, that a new method had to be found for matching the images of the desired position on the printed circuit board and the electronic component. It was not anymore feasible to use the complete image of the component. Furthermore, observing the images through a microscope was rather strenuous to the observing eye.

By projecting the images onto a video camera the images are observable on a display monitor. The problem of this method is the low resolution of the camera or the display monitor; the large number of the narrowly spaced leads of the component interferes with the display lines making precise matching of the images of the component difficult.

DESCRIPTION OF THE INVENTION

The present invention maintains the principle for positioning components by matching images of component and footprint of the placement position. A new method for precise placement of small or large components using selectively complete or partial images of the desired placement position on the printed circuit board and corresponding complete or partial images of the electronic component to be placed. For large components two partial images of opposite corners of the desired placement location and two partial images of opposite corners of the component to be placed are used. The images can be observed via a video camera on a display screen. This method provides a large detailed display and avoids interference of the line structure of the video picture of the images with the details of the displayed images. The partial images are derived from the original images by splitting the complete images into two partial images using two mirrors in the optical path between the beam splitter which overlays the image of the component and the image of the placement location in the component carrier board and the video camera. When positioned in a common plane the two mirrors reflect the complete images into the video camera, as would be useful when placing small components. By tilting the mirrors in opposite directions and reflecting the image on the outside of the flat V-shaped mirror arrangement partial images are provided. Separation of the partial images depends on the position of the tilt axes of the mirrors. Placing the tilt axes parallel to one diagonal of the images of the desired placement position and the component allows to move opposite corners of the other diagonal by changing the tilting of the mirrors. Optical errors due to the different length of the two optical paths are compensated by tilting one mirror more than the other. The generated reflection picture of the images in a 90 degree reflection causes a 180 degree rotation of the image, which may be compensated by either appropriate positioning of the video camera or adjustment in the display device.

The apparatus of the present invention includes a printed circuit fixture with adjustable clamps for holding circuit boards of different thicknesses.

For easy positioning of the clamped printed circuit board the printed circuit fixture is mounted on a positioning table. The positioning table rests on a workbench. The positioning table is equipped with air bearing means which allow easy movement of the positioning table when the air bearing means are activated. For rotating the positioning table around the optical axis of the placement position a magnet can be activated which is located coaxial with that optical axis. The magnet restricts movement of the positioning table to rotation around the optical axis of the placement position.

To reduce damage to the component while placing the component in the positioning arm a vacuum controlled handler is provided with a tip controlled vacuum control.

For improved reliability the apparatus of the present invention includes a beam splitter of novel design.

SHORT DESCRIPTION OF THE DRAWINGS.

FIG. 3B is an illustration of the major elements of the apparatus of the present invention.

FIG. 4 is an illustration of the extension of the optical path for use in combination with a video camera.

FIGS. 5A, 5B and 5C are illustrations of the images projected into the video camera.

FIGS. 7A and 7B are illustrations of the beam splitter and the means for adjusting the prisms of the beam splitter.

DESCRIPTION OF THE PREFERRED EMBODIMENT

Figure 1:
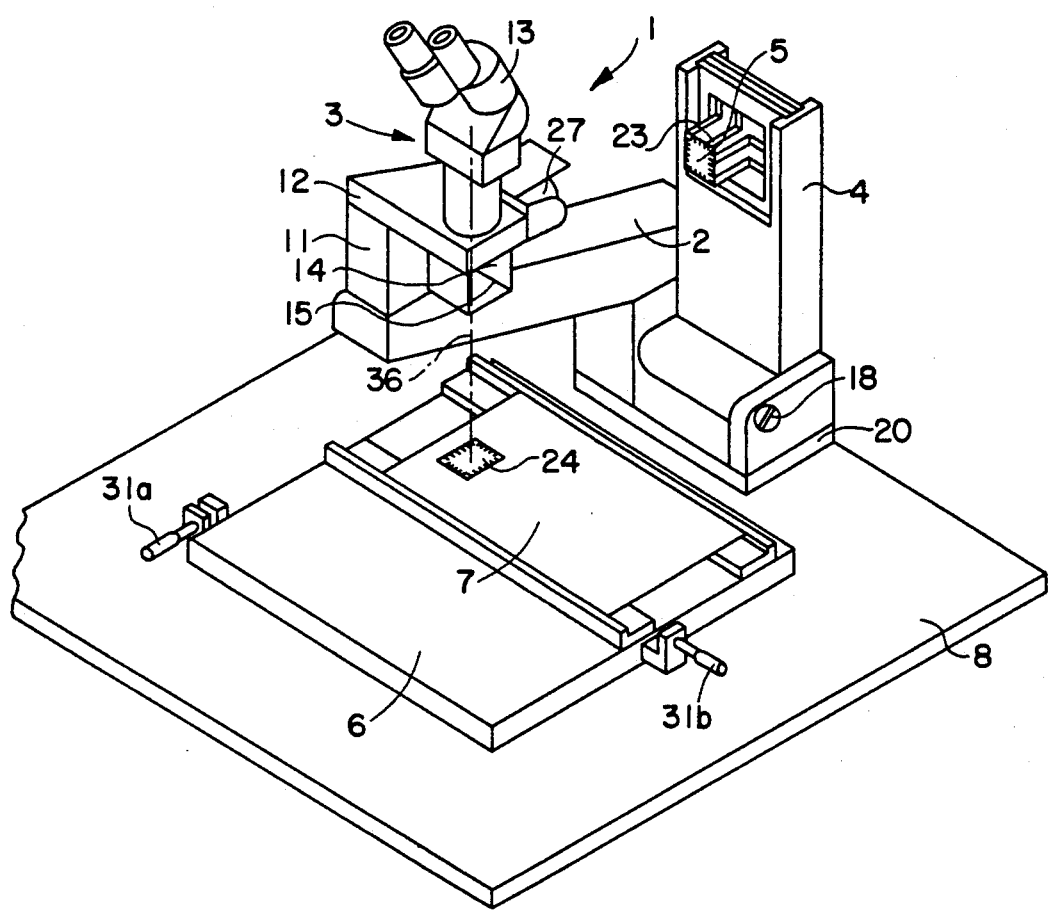
FIG. 1 is a perspective illustration of an apparatus for placing components on a printed circuit board.
Figure 2:
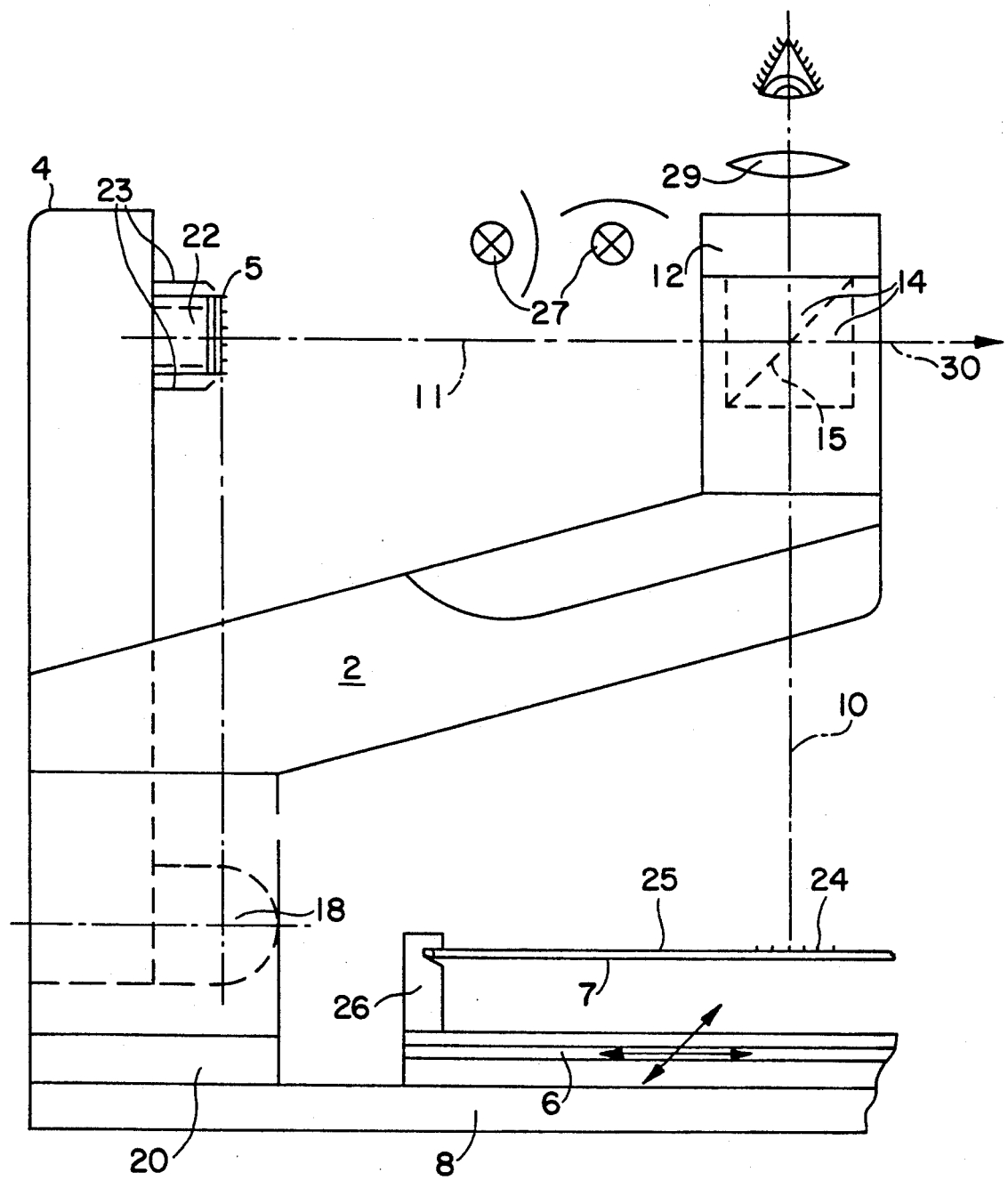
FIG. 2 is an illustration of the apparatus and the optical paths.

FIG. 1 is a perspective illustration of an apparatus for placing components on a printed circuit board or the like. FIG. 2 is an illustration of the optical path of the apparatus. A positioning fixture 6 includes control means 31a and 31b for horizontal positioning of a board 7 which is to receive an electronic component. Board 7 may be a printed circuit board or the like. Positioning fixture 6 is moveable relative to table 8, which may be a workbench or other stable platform. Affixed to table 8 in a predetermined relationship is base 20 of the component placement fixture which includes a tiltable component placement arm 4, and component holding fixture 23 and base 20. Optical assembly 3 includes microscope 13 and an optical beam splitter 15, assembled from two prisms 14. Lamps 27 illuminate board 7 and component 5 which is to be placed on board 7 and is held in holding fixture 23 of placement arm 4. Holding fixture 23 at the end of arm 4 may include a vacuum suction cup or the types of temporary holding means. Component holding fixture 23 is aligned with placement position 24 of which the center is aligned with vertical optical axis 32. Micrometers 31a and 31b are provided to position fixture 6 relative to the x and y coordinate system to move a desired placement position on board 7 to the actual placement position 24. Component holding fixture may include soldering means for soldering component 5 onto board 7.

Optical assembly 3 projects a first image of the underside of component 5 held in the component holding fixture 23 of arm 4 and a second image of placement location 24 on board 7 into microscope 13. Positioning controls 31a and 31b of positioning fixture 6 are provided to move board 7 in a position in which the image of component 5 overlaps and matches the image of desired location 24 on board 7 on which component 5 is to be positioned.

Tilting positioning arm 8 about 90 degree around axis 18 downward onto board 7 moves component 5 precisely into placement position 24. Affixing component 5 to board 7 may be done with a separate tool or soldering means attached to positioning arm 4.

This prior art arrangement satisfies the requirements for placing small and medium sized components. However, recently developed large sized components exceed the viewing field of microscope 13.

In FIG. 2 it is illustrated how the optical paths from the underside of the component 5 held in fixture 23 of component placement arm 4 and from the placement location 24 on the component carrier combine in beam-splitter 15. One combined image is provided observation through a microscope, represented by lens 29. The other combined image is projected along path 30 for use by a video image system, which is described in more detail below. Illumination lamps 27 provide a first illumination for the underside of component 5 and a different illumination for placement location 24. The difference in illumination may be in color and/or in strobe frequency. In the arrangement of the present invention it is of importance that the vertical optical path 10 defines a location matching with the location on the underside of component 5 which is defined by optical path 11, so that when placement arm 4 is lowered onto component carrier 25 these two defined points match.

Table 6 with fixture 26 is moveably mounted on table 8 to which placement arm 4 is attached via baseplate 20. Placement arm 4 is rotatable around axis 18 and has a length corresponding to the length of horizontal optical path 11.

Figure 3A:
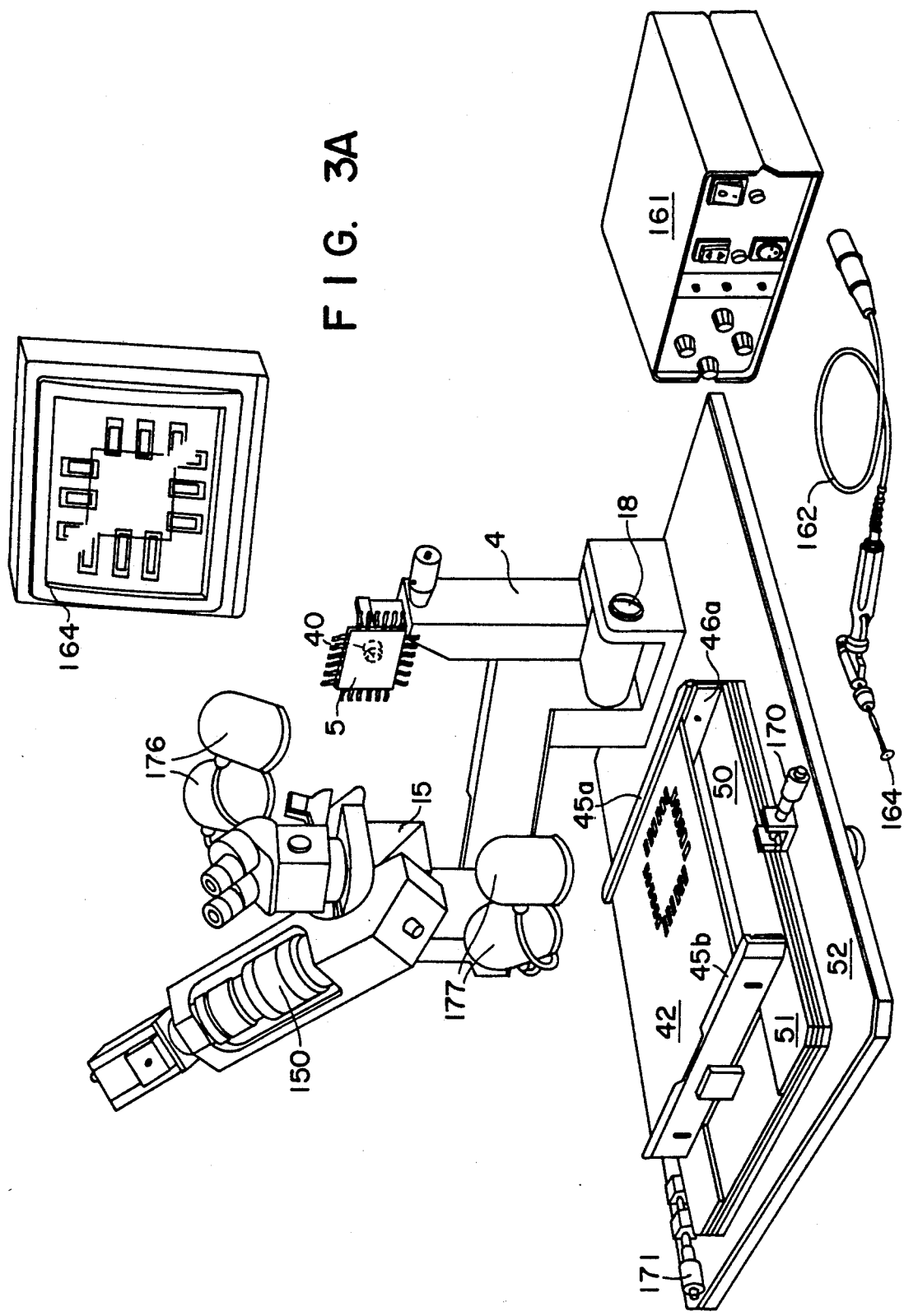
FIG. 3A is a perspective illustration of the apparatus of the present invention.

FIG. 3A is a perspective illustration of the present invention. The apparatus of the present invention for positioning components on a component carier such as a printed circuit board consists of 4 major components: the positioning table, vacuum controller controller 161, component handler 162 and video monitor 163.

Vacuum controller 161 is connected to vacuum controlled component handler 162 and to the vacuum suction cup 40 of component placement arm 4. When applying pressure on the suction pad 164 of handler 162 a sensor generates an electrical signal to vacuum controller 161. This signal is used in the transfer of components from a storage container to suction cup 40. In operation the vacuum is applied to the holding fixture 164 of handler 162 when the suction cup is pressed on the component. As soon as the component is properly positioned and pressed against suction cup 40 of the holding fixture of placement arm 4 vacuum is switched from the handler to the placement arm vacuum cup 40. The component is transferred from the handler fixture 164 to suction cup 40 of placement arm 4. A sensor attached to the placement arm 4 ensures that a switching vacuum can happen only if the placement arm is in the upright position.

The component 5 to be placed on a printed circuit board 42 is held in a position in which the solder surfaces of the contacts are in one plane including the axis of shaft 18, the pivot point of placement arm 4. Printed circuit board 42 is mounted in a fixture with its top surface in a second plane which is common with the axis of shaft 18, the pivot point of the placement arm 4. After pivoting placement arm 4 the two planes are coplanar, all solder surfaces of component 5 touch the solder pads of the printed circuit board 42 if circuit board 42 was properly positioned.

Proper positioning of board 42 to receive component 5 in a desired location is accomplished in several steps. Board fixture 50 is set to the thickness of the printed circuit board. When clamping the printed circuit board 42 the lower edges of printed circuit board 42 slide upwards on ramps on ramp blocks 46a and 46b until the top surface of the printed circuit board 42 presses against reference brackets 45a and 45b. The upper board stop determined the reference plane for the printed circuit board. Board fixture 50 can accommodate boards within a certain range of thickness. To accommodate boards of significantly different thicknesses ramp blocks 46a and 46b can be exchanged.

Horizontal positioning begins with moving positioning table 51 so that the optical axis of the placement position is close to the center of the desired placement position. This operation is performed while the air bearing means of table 52 are activated. A rotating magnet positioned underneath table 52 and not shown in FIG. 3A can be energized so that positioning table 51 together with printed circuit board 42 can be rotated so that the image of the desired placement position has the same rotational position as the image of the component held in the placement arm. The rotational positioning operation may be performed while the air bearing means are deactivated. Micrometer controlled positioning means 170 and 171 are used to achieve a complete match of the desired placement position image and the component image in x and y direction. Pivoting placement arm 4 into the down position places the component precisely in the desired placement position on printed circuit board 42. If the component fixture of placement arm 4 includes a soldering tool, the component can immediately be affixed to the circuit board.

The positioning of the desired placement position on board 42 into the actual placement position and the rotational match of the desired placement position with the component are optically observed by the operator of the apparatus. In FIG. 3A the apparatus has two means to perform this task. A binocular microscope 175 and a video camera 150 with a monitor 163. Two sets of lamps 176 and 177 are provides to illuminate the underside of component 5 and present placement position on board 42. The images of the underside of component 5 and the present placement position on board 42 are combined in beam splitter 15. Beam splitter 15 with the prisms 14 provides a first image for observation through microscope 175 and a second image to video camera 150 for observation on monitor 163. To identify the image of component 5 and the image of the present placement position the two lamp sets may have different color filters or may be strobed at different frequencies. Separate controls (not shown) are provided for lamps 176 and 177 to change intensity, strobe frequency etc. While positioning board 42 to match the desired placement position and its pattern with the image of component 5 only the image of the present placement position changes until the desired placement position is the present placement position and its pattern matches the pattern of component 5. Pivoting placement arm 4 around the axis of shaft 18 into by 90 degree onto board 42 placed component 5 precisely in the desired location on board 42. As will be disclosed below, the attachment 178 holding camera 150 includes a special and novel arrangement of mirrors which project the image received from beam splitter 15 into camera 150. This novel arrangement of mirrors can provide matching split images of the underside of component 5 and present placement location on board 42. This feature provides for handling even large components with small features, which would otherwise interfere with the raster structure of the monitor image. The picture simulated on the screen of monitor 163 is an illustration of such a split image. FIG. 3B is an illustration of the major elements and the optical system of the present invention. Component 5 is held in vacuum suction cub 40 of the component holding fixture of the placement arm. The tiltable placement arm can be of equal or similar construction as placement arm 4 in FIGS. 1 and 2. The placement arm can be tilted 90 degree around center point 41 for moving component 5 to the placement position. Center point 41 corresponds to tilt axis 18 in FIGS. 1 and 2. The center point of the component holding fixture in the placement arm is in line with axis 57 when the placement arm is in the upright position. When tilted 90 degree for placing a component the center point of the component holding fixture gets in line with the center point of the placement position and in line with axis 56. In FIG. 3A component 5a is the component 5 shown in the placement position. The placement position is fixed relative to point 41. Component board 42 on which component 5 is to be placed is mounted in a fixture which includes at least two clamping means holding component board 42 at opposing edges. The clamping means can be adjusted to the size and thickness of component board 42. Such a clamping means may consist of a reference bracket 45 and an adjustable ramp block 46. Reference bracket 45 ensures that top surface 42a of component board 42 is in a plane including reference point 41. When clamping component board 42 the edge of the underside of component board slides up the ramp of ramp block 46 until component board 42 is in proper reference position as determined by reference bracket 45. Ramp block 46 may be screwed on to reference bracket 45 as indicated by a line 47, providing the possibility for adjustment tot he component boards of significantly different thicknesses and for exchange with a block of a different type ramp or a special component board holding feature, as may be required in a particular application.

The fixture of which holding clamp 45, 46 is a part of is connected to positioning table 50. As shown in FIG. 3A positioning table 50 include means for X-Y fine positioning relative to table base plate 51 by use of micrometers. Table base plate 51 rests on an air bearing table 52. The air bearing feature may be activated, causing a small gap 53 between air bearing table 52 and table base plate 51. Air bearing may be accomplished by at least one holes in air bearing table 52. One holes 54 providing compressed air for the air bearing is located beneath the center point of the placement location.

Concentric with the placement position and optical axis 56 there is an electromagnet 55 underneath air bearing table 52. When activated magnet 55 allows to rotate table base plate 51 around center axis 56 of the placement location. In FIG. 3B magnet 55 is shown to be a circular ring magnet.

To align a component held in suction cup 40 of the placement arm in the upright position with the desired position on component board 42 both the underside of component 5 and the placement position as defined by axis 56 are illuminated. The two images are merged in beam splitter 15 and the combined images on axis 58 can be observed via a camera on a video display. By moving component board 42 in X and Y directions and rotating it around axis 56 the image of the desired placement location is moved to the actual placement position and aligned with the image of the underside of component 5. Upon match-up the placement arm is rotated 90 degree around axis 41 moving component 5 along dotted line 59 into placement position 5a.

FIG. 4 is a perspective illustration of the extension of the optical path for use in combination with a video camera. Beamsplitter 15 is the center part of the optical system. Beamsplitter 15 consists of the prism 14a and 14b. The common plane of prisms 14a and 14b is a semipermeable mirror. In this application the part of the image of the underside of component 5 passes through the semipermeable mirror. The image of the footprint at placement location 24 is reflected into the same direction. Thus the images of the under side of component 5 and the footprint in placement location 24 are combined. The combined images are reflected by mirrors 151 and 152 into video camera 150. Mirrors 151 and 152 have adjacent parallel edges 112 which is oriented at a right angle to the the axis of the optical path of camera 150 and 45 degree to the combined image. Mirrors 151 and 152 can be tilted around axes 161 and 162, respectively. Axes 162 and 162 are parallel to edges 112 and therefore angles under 45 degree to the combined image. By tilting mirrors 151 and 152 different parts of the combined image are reflected into video camera 150. Due to the 45 degree angle between the combined image and the tilt axes 161 and 162 partial sections of the combined image are selectable along diagonal 163a and 163b of the underside of component 5 and the footprint of placement location 24, respectively. The indicated right angle between edges 112 and the optical axis of video camera 150 prevents distortion of the selected combined partial image.

FIGS. 5A through 5C are illustrations of images projected along optical path 58 of FIG. 3B for use in combination with a video camera. In FIG. 5A an image 160 of a surface mount component 5 is shown in relation to the size of beam splitter 15. (The second image of the present placement position on board 42 is not shown.) Due to increased size of the components, smaller sizes of the terminals of the components and the narrower spacing between the terminals the display of the image of a large component with narrow spaced terminals may interfere with the raster of the video system and distort the image to an extend that proper placement of the component is not ensured. The present invention overcomes the this problem in a surprisingly simple way. Instead of providing an image of the whole component 5 and the placement position on the component board the arrangement of the present invention uses corresponding partial images of component 5 and the placement location. The enlarged partial images eliminate the distortions of the images. In the apparatus for placing large components on a board, the optical system is extended by an arrangement of two mirrors 151 and 152, and a video camera 150 which is connected to a video display, not shown in FIGS. 5. The operation and function of the apparatus remains otherwise unchanged. The optical image projected from beam splitter 15 is deflected by mirrors 151 and 152 along the optical path 156 to video camera 150, providing two partial images. Matching the image of the underside of component 5 with the image of the placement location on component board 7 can still be observed on the video display, if mirrors 151 and 152 are coplanar. By tilting mirrors 151 and 152 opposing areas of the image received from beam splitter 15 can be moved towards each other. By arranging the tilt axes of mirrors 151 and 152 parallel to the diagonal of the placement location opposing corners of the placement location and corresponding features of the component to be placed can be moved towards each other. FIGS. 5B and 5C illustrate the effect of selecting opposing corners of a component and the placement location, moving the towards each other and enlarging the resulting image.

Figure 6A:
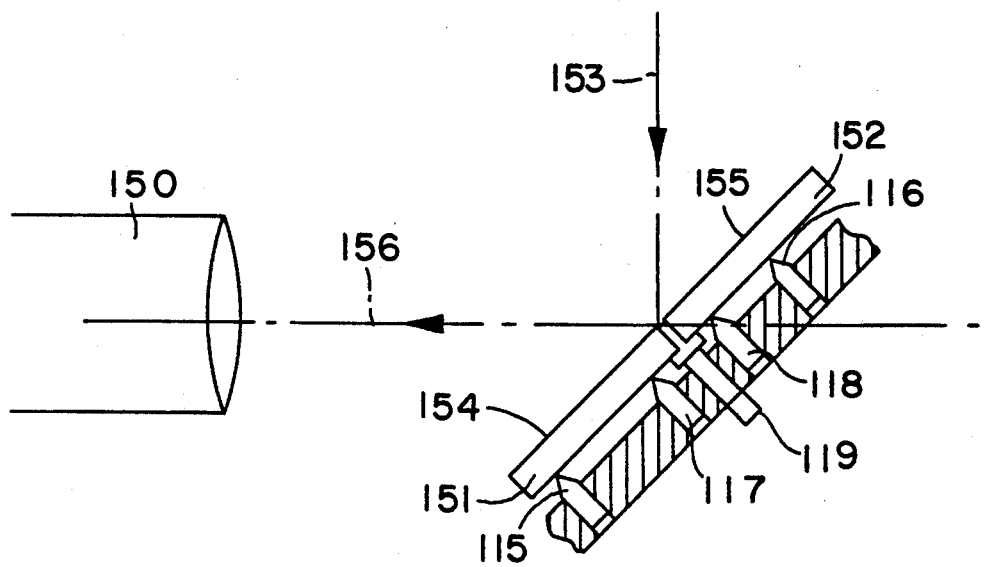
FIG. 6A is an illustration of a set of partial image deflection mirrors with two tilt axes

FIG. 6A is an illustration of a set of partial image deflection mirrors with two tilt axes. Mirrors 151 and 152 are separately adjustable to different angles relative to the optical path 153 exiting beam splitter 15. Optical path 153 corresponds to optical path 58 in FIG. 3B. If the reflecting surfaces 154 and 155 of both the mirrors 151 and 152 are in the same plane the full images exiting from beam splitter 15 in the extension of the optical path from components 5 to beam splitter 15 are reflected into camera 150 along path 156. By turning mirrors 151 and 152 by 45 degrees from the horizontal around the image axis 153 the images are reflected in such a fashion that a square component is divided in two areas 110 and 111 separated at the diagonal 112 between two opposing corners, see FIG. 5A. The two mirrors 151 and 152 reflect each a partial image. Tilting mirrors 151 and 152 away from beam splitter 15 allows to select areas of the partial images further away from the diagonal of the component. This effect allows to match partial images of the component and the placement location to be observed, especially opposing corner sections, as indicated in FIGS. 5B and 5C. FIG. 6A is an illustration of the tilting mechanism. The two partial image mirrors 151 and 152 rest on tilt bearings 115 and 116, respectively. Adjustment screws 117 and 118 are provided to define the planar position of mirrors 151 and 152. An image control screw 119 allows to move the adjacent edges of mirrors 151 and 152 out of the plane of the planar position. To adjust for difference in the optical paths mirror 152 is tilted by a larger angle than mirror 151. This is accomplished by spacing tilt bearing 116 closer to image control screw 119 than tilt bearing 115 of mirror 151. This arrangement ensures that the image separation line 112 does not move while the mirrors are adjusted for optimum view of the opposing corners of the component and the placement location. In FIG. 5C arrows 120 and 121 indicate the movement of opposite corners of the image relative to image separation line 112. The axes of two tilt bearing 115 and 116 have to be normal to the plane defined by optical axes 153 and 156.

The optical system of camera 150 allows to enlarge the image so that the spacing of the terminals does not anymore interfere with the line characteristic of the video system, and allows precise placement of the component at a desired placement location on board 7.

Figure 6B:
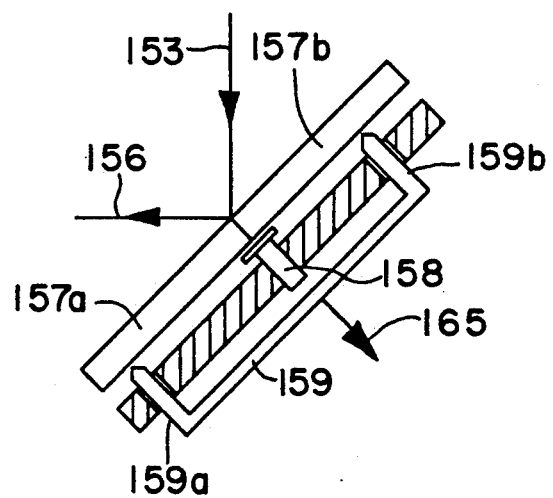
FIG. 6B is an illustration of a set of partial image deflection mirrors with a common tilt axis.

FIG. 6B is an illustration of a set of partial immage mirror wit a common tilt axis. Mirrors 157a and 157b correspond to mirrors 154 and 155 in FIG. 6a. In the arrangement of FIG. 6b center support set screw 158 is fixed, and a clip 159 with support pins 159a and 159b control the tilting of mirrors 157a and 157b. When moving clip 159 in the direction of arrow 165 mirrors 157a and 157b are tilted around a common axis determined by set screw 158. The opticals axes 153 and 156 of the mirror arrangement for partial image generation is the same as in FIG. 6A. To compensate for change in optical path length the space between pin 159a anf set screw 158 is larger than the space between pin 159b and set screw 158.

Prepositioning of the printed circuit board is simplified by a positioning light beam illuminating the present placement position.

Rotational positioning can be simplified by mounting the positioning magnet in bearing means and by means for controlling fractional rotation of the positioning table.

Figure 7A:
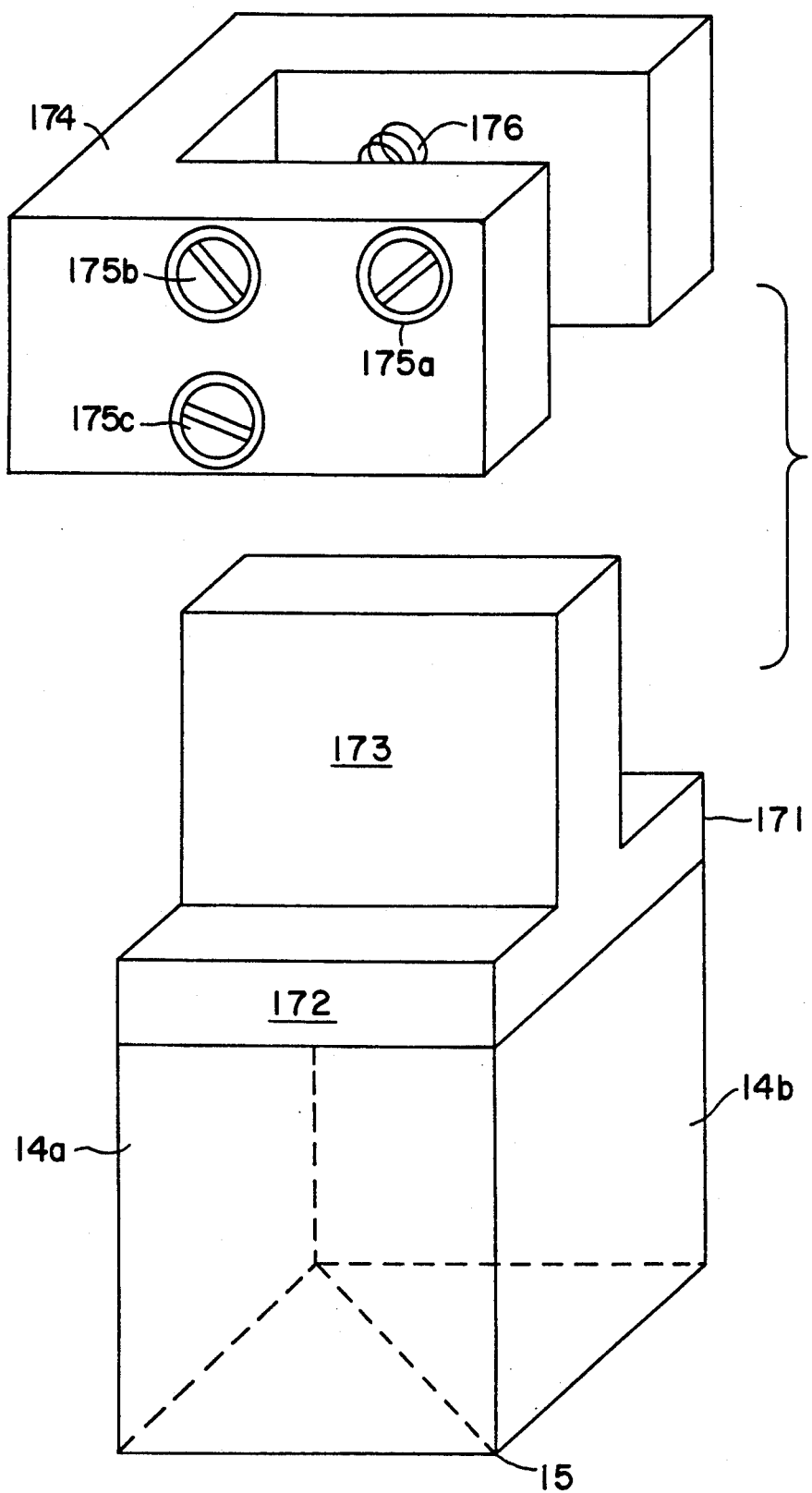
Figure 8:
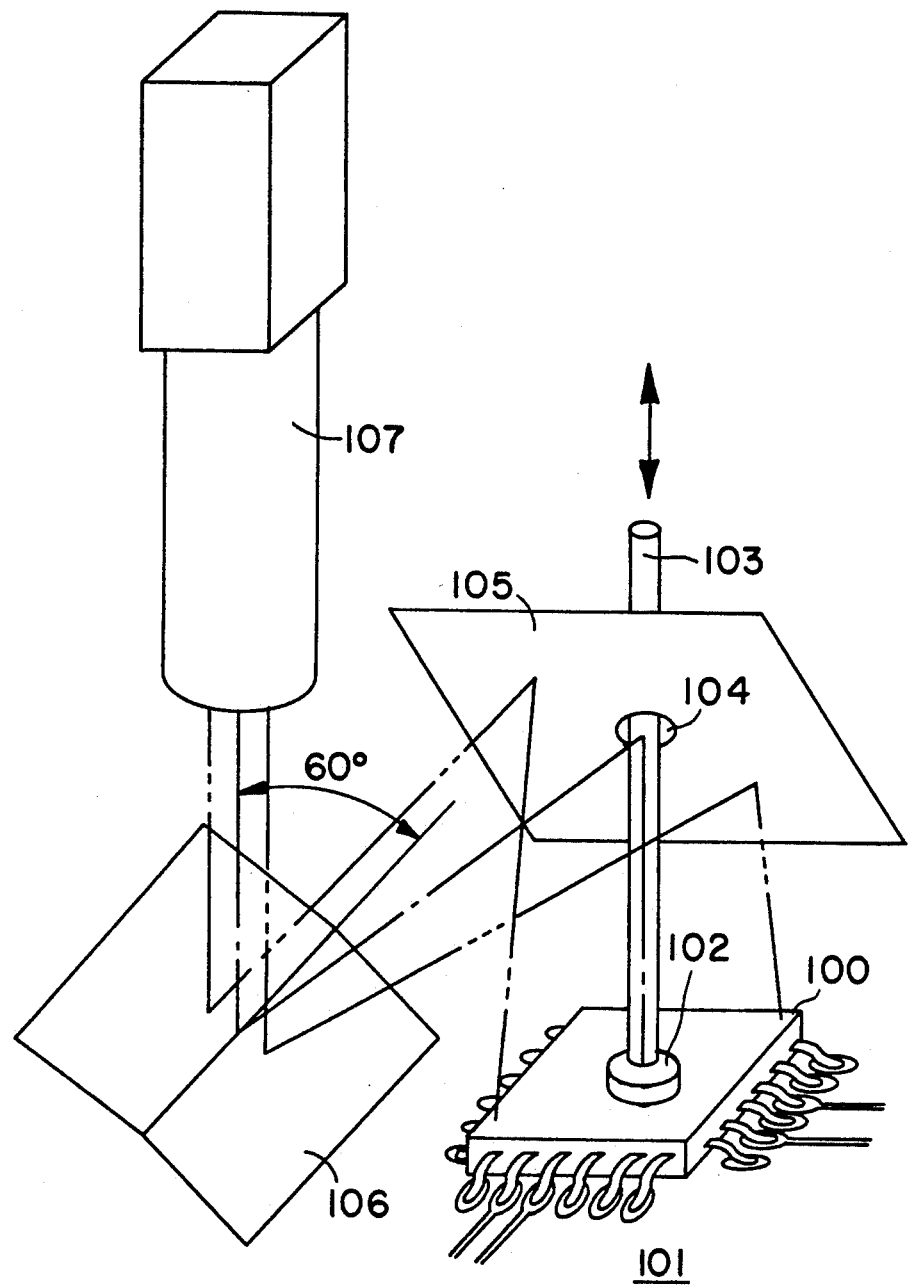
FIG. 8 is an illustration of the optical path and functional principle of a fine placement apparatus with video camera (Prior art).

FIGS. 7A and 7B are examples for mounting beamsplitter 15. To ensure proper and precise operation of the positioning apparatus beamsplitter 15 has to be adjusted for proper angular position. A mis-alignment will not project the proper combined images into video camera 150 (see FIG. 5A). The mounting arrangement of FIG. 7A uses set screws and springs to position beamsplitter 15. Beamsplitter prisms 14a and 14b are adhesevely attached flange 172 of T-shaped mounting head 171. Flange 173 is inserted in U-shaped clamp 174. Three set screws 175a through 175c and spring 176 determine the position of flange 173 in clamp 174. Spring 176 is located in clamp flange 177 in a location determined by the center of the triangle formed by set screws 175a through 175c in the opposite flange 178. Set screw 175a adjusts the angular position of beamsplitter 15 relative to an axis determined by set screws 175b and 175c. Set screw 175c adjusts the angular position of beamsplitter 15 relative to a vertical axis in front side 182 of flange 173 given by the contact points of set screws 175a and 175b with flange 173.

FIG. 7B is an illustration of a different adjustable mounting device for beamsplitter 15. The prisms of beamsplitter 15 are adhesively attached to a baseplate 190. A T-shaped mounting piece 191 and baseplate 190 have opposing V-grooves 210a and 210b, respectively. Located in opposing V-grooves is a shaft 192. Two screws 193a and 193b attach T-shaped piece 191 to baseplate 190 and determine the angular position of beamsplitter 15 relative to T-shaped piece 191. Flange 194 of piece 191 is inserted into U-shaped clamp 196. U-shaped clamp 196 includes on the inside of far flange 197 a V-groove 199 matching a V-groove 200 in the farside of flange 194. A shaft 198 is held in grooves 199 and 200. Two set screws 201a and 201b in near flange 203 of clamp 196 and located about symmetrically to groove 199 determine the angular position of beamsplitter 15 relative to shaft 198. Shafts 192 and 198 are right-angled to each other.

It is obvious that one of the screws 193a and 193b can be replaced by an expansions spring; and one of the set screws 201a and 201b could be replaced by a compression spring. Other means may be included to firmly secure the mounting of beamsplitter 15 without departing from the spirit of the present invention.

What I claim is:

1. A component placement system for positioning a component in a desired placement location on a component board or the like comprising
holding means for receiving said component including positioning means for positioning said component in a placement location on said component board, said placement location and said holding means being in a predetermined relationship;
said holding means including tilt means for moving said component from a positioning location to said placement location; means for illuminating said component and said placement location on said component board;
means for optically relating said component held in said holding means with said placement location on said component board, including means for providing an overlapped bottom view image of said component and said placement location,
said overlapped image having a central axis;
means for moving said desired placement location on said component board to said placement location;
a video camera having an optical axis;
means for reflecting said overlapped image into said video camera for display on a video display;
means for displaying said overlapped image in an upright position on said video display.

2. A component placement system for positioning a component in a desired placement location on a component board or the like as claimed in claim 1 wherein said video camera being rotated around said central optical axis for displaying said overlapped image in the upright position.

3. A component placement system for positioning a component in a desired placement location on a component board or the like as claimed in claim 1 wherein said video display includes means for displaying said overlapped image in the upright position.

4. A component placement system for positioning a component in a desired placement location on a component board or the like as claimed in claim 1 wherein said means for reflecting said overlapped image into said video camera include a first and a second mirror.

5. A component placement system for positioning a component in a desired placement location on a component board or the like as claimed in claim 4 wherein said first and said second mirrors having adjacent parallel edges and a common tilt axis between and parallel to said adjacent edges,
said common tilt axis being normal to said axis of said camera; said means for reflecting further including means for controlling tilt angle between said first and second mirrors.

6. A component placement system for positioning a component in a desired placement location on a component board or the like as claimed in claim 4 wherein said first mirror being tiltable around a first axis, and said second mirror being tiltable around a second axis; said first axis and said second axis being parallel axes.

7. A component placement system for positioning a component in a desired placement location on a component board or the like as claimed in claim 6 wherein said parallel axes being angled relative to said overlapped image by a first angle; said first angle being selected for reflecting a pair of opposing corners of said component into said camera.

8. A component placement system for positioning a component in a desired placement location on a component board or the like as claimed in claim 6 wherein said first mirror being tilted for reflecting one corner of said component into said camera, said second mirror being tilted for reflecting second corner of said component into said camera, said first and said second corner of said component being opposite corners of the component.

9. A component placement system for positioning a component in a desired placement location on a component board or the like as claimed in claim 6 wherein said first mirror being tilted by a second angle for reflecting one corner of said component into said camera, said second mirror being tilted by a third angle for reflecting second corner of said component into said camera, said second angle being different from said third angle.

10. A component placement system for positioning a component in a desired placement location on a component board or the like as claimed in claim 6 wherein said first axis of said first mirror and said second axis of said second mirror being perpendicular to said axis of said camera.

11. A component placement system for positioning a component in a desired placement location on a component board or the like comprising
   holding means for receiving and holding said component in a vacuum suction cup,
   said holding means including positioning means for positioning said component in a placement location on said component board,
   said placement location and said holding means being in a predetermined relationship;
   said holding means including tilt means for moving said component from a positioning location to said placement location; means for illuminating said component and said placement location on said component board;
   means for optically relating said component held in said holding means with said placement location on said component board,
   including means for providing an overlapped image of said component and said placement location,
   said overlapped image having a central axis;
   means for moving said desired placement location on said component board to said placement location;
   means for reflecting said overlapped image into a video camera for display on a video display;
   component transfer means including a movable vacuum suction cup and a vacuum controller providing a vacuum to said suction cup of said holding means and said transfer means.

12. A component placement system for positioning a component in a desired placement location on a component board or the like as claimed in claim 11 wherein said movable suction cup includes a first switch for switching said vacuum from said movable vacuum cup to said vacuum cup of said holding means, thereby transferring a component held in said movable suction cup to said suction cup of said holding means.

13. A component placement system for positioning a component in a desired placement location on a component board or the like as claimed in claim 11 wherein said holding means includes a second switch for releasing said component from said suction cup of said holding means when said holding means are tilted and said component is in said placement location.

14. A component placement system for positioning a component in a desired placement location on a component board or the like as claimed in claim 11, wherein said means for providing an overlapped image include a beamsplitter.

15. A component placement system for positioning a component in a desired placement location on a component board or the like as claimed in claim 14 wherein said means for providing an overlapped image further include means for angular adjustment of said beamsplitter in a vertical and one horizontal axis.

16. A component placement system for positioning a component in a desired placement location on a component board or the like as claimed in claim 15, wherein said means for optically relating said component to said placement location having a horizontal optical path to said component and a vertical optical path to said placement location, and wherein said horizontal axis is normal to a plane including said horizontal and said vertical optical paths.

17. A component placement system for positioning a component in a desired placement location on a component board or the like comprising
   holding means for receiving and holding said component in a vacuum suction cup,
   said holding means including positioning means for positioning said component in a placement location on said component board, said placement location and said holding means being in a predetermined relationship;
   said holding means including tilt means for moving said component from a positioning location to said placement location; means for illuminating said component and said placement location on said component board;
   said position location having a first axis, said placement position having a second axis;
   means for optically relating said component held in said holding means with said placement location on said component board, including means for providing an overlapped image of said component and said placement location,
   said overlapped image having a central axis;
   component board positioning means including component board clamping means and first positioning means for moving said component holding means to move said desired placement location no said component board to said placement location;
   means for reflecting said overlapped image into a video camera for display on a video display;
   component transfer means including a movable vacuum suction cup and a vacuum controller providing a vacuum to said suction cup of said holding means and said transfer means.

18. A component placement system for positioning a component in a desired placement location on a component board or the like as claimed in claim 17, wherein said placement system includes an air bearing support for said component board positioning means.

19. A component placement system for positioning a component in a desired placement location on a component board or the like as claimed in claim 12, wherein said first and second positioning means move said component holding means in a first and a second linear direction.

20. A component placement system for positioning a component in a desired placement location on a component board or the like as claimed in claim 19, wherein said first and second positioning means include micrometers for precise positioning said desired placement location in said placement position.

21. A component placement system for positioning a component in a desired placement location on a component board or the like as claimed in claim 17, wherein said placement system including third positioning means for rotating said component board around said second axis.

22. A component placement system for positioning a component in a desired placement location on a component board or the like as claimed in claim 21, wherein said third positioning means including a magnet aligned with said second axis for rotating said component board positioning means around said second axis.

23. A component placement system for positioning a component in a desired placement location on a component board or the like as claimed in claim 22, wherein said magnet is a controllable electromagnet.

24. A component placement system for positioning a component in a desired placement location on a component board or the like as claimed in claim 17 wherein said means for optically relating said component with said placement location includes first means for illuminating the bottom side of said component and second illuminating means for illuminating said placement location.

25. A component placement system for positioning a component in a desired placement location on a component board or the like as claimed in claim 24 wherein said first illuminating means illuminated said bottom of said component in a first color, and said second illuminating means illuminated said placement location in a second color.

26. A component placement system for positioning a component in a desired placement location on a component board or the like as claimed in claim 25 wherein said first illuminating means illuminated said bottom of said component with light blinking at a first frequency, and said second illuminating means illuminated said placement location with light blinking at a second frequency.

* * * * *